United States Patent
Grenouillet et al.

(10) Patent No.: US 8,877,618 B2
(45) Date of Patent: Nov. 4, 2014

(54) METHOD FOR PRODUCING A FIELD EFFECT TRANSISTOR WITH A SIGE CHANNEL BY ION IMPLANTATION

(71) Applicant: Commissariat a l'Energie Atomique et aux Energies Alternatives, Paris (FR)

(72) Inventors: Laurent Grenouillet, Rives (FR); Maud Vinet, Rives (FR); Yannick Le Tiec, Crolles (FR); Romain Wacquez, Marseilles (FR); Olivier Faynot, Seyssinet-Pariset (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/073,402

(22) Filed: Nov. 6, 2013

(65) Prior Publication Data
   US 2014/0127871 A1    May 8, 2014

(30) Foreign Application Priority Data
   Nov. 7, 2012  (FR) .................................. 12 02981

(51) Int. Cl.
   *H01L 21/20*   (2006.01)
   *H01L 21/266*  (2006.01)
   *H01L 29/66*   (2006.01)
   *H01L 29/78*   (2006.01)
   *H01L 21/265*  (2006.01)
   *H01L 29/786*  (2006.01)
   *H01L 29/165*  (2006.01)

(52) U.S. Cl.
   CPC ........ *H01L 21/26513* (2013.01); *H01L 21/266* (2013.01); *H01L 29/66742* (2013.01); *H01L 29/7848* (2013.01); *H01L 29/165* (2013.01); *H01L 21/26506* (2013.01); *H01L 21/26586* (2013.01); *H01L 29/78684* (2013.01)
   USPC .................... 438/486; 438/285; 257/E21.561

(58) Field of Classification Search
   USPC ........................ 438/495; 257/E21.4, E21.615
   See application file for complete search history.

(56) References Cited

U.S. PATENT DOCUMENTS

| 5,726,459 A | 3/1998 | Hsu et al. |
| 2004/0147070 A1 | 7/2004 | Lei et al. |
| 2005/0255660 A1 | 11/2005 | Lin et al. |
| 2010/0078727 A1 * | 4/2010 | Min et al. ...................... 257/369 |

OTHER PUBLICATIONS

Yuk et al., "SiGe Synthesis by Ge Ion Implantation," *Japanese Journal of Applied Physics*, 2012, pp. 09MF03, vol. 51, The Japan Society of Applied Physics.
Agarwal, "Ultra-shallow junction formation using conventional ion implantation and rapid thermal annealing," *Proceedings of the 2000 International Conference on Ion Implantation Technology*, 2000, pp. 293-299, IEEE.
Tezuka et al., "Selectively-formed high mobility SiGe-on-Insulator pMOSFETs with Ge-rich strained surface channels using local condensation technique," *2004 Symposium on VLSI Technology Digest of Technical Papers*, 2004, pp. 198-199, IEEE.

* cited by examiner

*Primary Examiner* — Cheung Lee
(74) *Attorney, Agent, or Firm* — Oliff PLC

(57) ABSTRACT

The semiconductor-on-insulator substrate includes a support, an electrically insulating film, a crystalline film made from semiconductor material, and a protection layer. Germanium ions are implanted in the semiconductor material film through the protection layer so as to form an amorphized area in contact with the protection layer and a crystalline area in contact with the electrically insulating film. The semiconductor material film is annealed so as to recrystallize the amorphized area from the crystalline area.

7 Claims, 3 Drawing Sheets

METHOD FOR PRODUCING A FIELD EFFECT TRANSISTOR WITH A SIGE CHANNEL BY ION IMPLANTATION

BACKGROUND OF THE INVENTION

The invention relates to a method for producing a silicon-germanium film for a field effect device.

STATE OF THE ART

The continuous increase of the performances of integrated circuits, for example in terms of consumption and/or operating frequency, is ineluctably resulting in a constant reduction of the size of its components. In order to produce devices with ever-increasing performances, new architectures and/or new materials have been integrated in transistors.

The current microelectronics technology, based on silicon, is reaching the limits of the possibilities offered by this material. The increasing requirements for electronic devices with even better performances, that are faster and less power-consuming, have led to new solutions being studied.

In comparison with silicon, pure germanium presents a mobility that is twice as high for the electrons and four times greater for the holes. The drawback of germanium transistors is the cost of the substrate which is about 10 times greater than that of a bulk silicon substrate. Furthermore, it is very difficult to form high-quality channels made from pure germanium by epitaxy of germanium on a silicon substrate. One solution is to form a channel made from silicon-germanium alloy in order to increase the performances of the transistor without having the drawbacks of pure germanium.

A particular application concerns p-type field effect transistors (pMOSFET: metal-oxide-semiconductor field-effect transistor). The article "Selectively-formed high mobility SiGe-On-Insulator pMOSFETs with Ge-rich strained surface channels using local condensation technique" by T. Tezuka et al. (2004 IEEE Symposium on VLSI Technology Digest of technical papers) in particular describes production of a pMOSFET with a particularly perceptible increase of the performances for charge carrier depleted transistors (FD pMOSFET) made from germanium.

However, this technique is particularly difficult to implement for substrates of semiconductor on insulator type with thin films. The temperature applied to obtain diffusion of the germanium atoms in the semiconductor film also results in a modification of the configuration of the substrate. The modifications of the substrate are all the greater the smaller the thicknesses.

A major drawback of the germanium condensation technique for fabrication of a substrate comprising a $Si_{1-Xf}Ge_{Xf}$ compound is relaxation of the strains in the germanium-enriched final layer. When oxidation of the $Si_{1-Xi}Ge_{Xi}$ layer takes place, there is competition between oxidation of the silicon and diffusion of the germanium. A large composition gradient can lead to a local strain state such that the layer relaxes plastically. This then results in the appearance of crossed dislocation lattices in the final layer, resulting in particular in a poor quality of the substrate.

One way of circumventing this problem resides in implantation of germanium atoms in the semiconductor on insulator film. However, germanium implantation does not enable a silicon-germanium on insulator film to be produced in reliable and industrial manner.

It is in fact necessary to implant a large quantity of germanium ions in order to transform a silicon film into a silicon-germanium alloy. Implantation of this large quantity of ions makes the method particularly sensitive to the phenomenon of amorphization of the semiconductor film which then loses its crystalline nature.

Furthermore, for formation of a silicon-germanium thin film, the implantation method is particularly sensitive to the variations of thicknesses which result in large variations of performance.

OBJECT OF THE INVENTION

The object of the invention is to produce a substrate provided with a silicon-germanium film that is easier to implement.

The method according to the invention is characterized in that it successively comprises:
  providing a substrate of semiconductor on insulator type successively comprising: a support, an electrically insulating film, a crystalline film made from semiconductor material, and a protection layer,
  implanting germanium ions in the semiconductor material film through the protection layer so as to form an amorphized area in contact with the protection layer and a crystalline layer in contact with the electrically insulating film,
  annealing the semiconductor material film so as to recrystallize the amorphized area from the crystalline area.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

The method for producing a silicon-germanium film comprises provision of a substrate of semiconductor on insulator type. The substrate successively comprises a support 1, an electrically insulating film 2, a crystalline film made from semiconductor material 3 and a protection layer 4. Support 1 can comprise several layers made from different materials. Electrically insulating film 2 is made from a different material from support 1.

Figure 1:
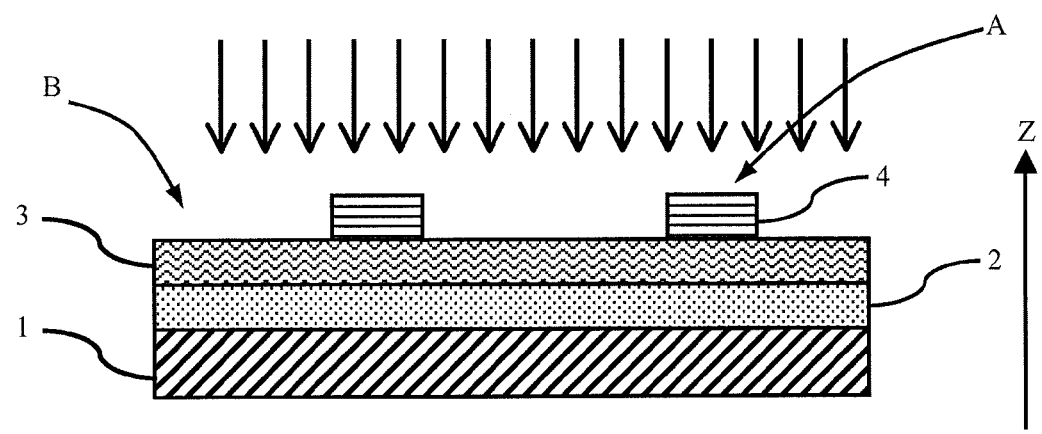
FIG. 1 represents a step of performing a germanium implantation method, in schematic manner in cross-section.

As illustrated in FIG. 1, in advantageous manner, support 1 is a bulk silicon substrate which enables an inexpensive support 1 compatible with a very wide range of technological steps to be had. However, depending on the applications, another type of material can be provided.

Electrically insulating film 2 enables support 1 and semiconductor material film 3 to be electrically insulated. Electrically insulating film 2 can be a film made from silicon oxide, silicon nitride, or a stack of these two films. It can also be envisaged to use other electrically insulating materials.

Semiconductor material film 3 is crystalline, i.e. single-crystal or polycrystalline. In advantageous manner, semiconductor material film 3 is single-crystal in order to facilitate production of high-performance and repeatable field effect transistors. Semiconductor material film 3 comprises silicon, typically at least 99% of silicon, and advantageously at least one layer of silicon so as to form a SiGe film.

Silicon layer 3 can be doped by electrically active impurities before implantation of the germanium ions. The electrically active impurities are for example boron, arsenic and phosphorus. It is also possible to form implantation of the doping impurities after implantation of the germanium ions. Implantation of the electrically active impurities can also be performed after implantation of the germanium.

Protection layer 4 is arranged on semiconductor material film 3. Protection layer 4 can be formed by any suitable material. Protection layer 4 is advantageously formed by an electrically insulating material, for example a silicon oxide, a silicon nitride, or a material with a higher dielectric constant such as for example $Al_2O_3$, $HfO_2$ or $HfSiO_2$. It is however also possible to deposit an electrically conducting material or a semiconducting material.

Protection layer 4 can be formed by a film or by a plurality of different films. It is also possible to make a stack of several electrically conducting or insulating materials and possibly of semiconductor materials. In advantageous manner, protection layer 4 is homogenous in composition and in thickness in order to make it easier to obtain a homogenous silicon-germanium alloy.

In advantageous manner, the material forming protection layer 4 can be selectively etched with respect to the semiconductor material forming film 3.

In order to form a SiGe film, for example a SiGe channel, i.e. a semiconducting connection between a source electrode and a drain electrode, germanium ions are implanted in semiconductor film. The germanium ions are implanted through protection layer 4. In order to have a notable effect of the germanium ions on the electric performances of the transistor, it is necessary to introduce a large quantity of ions into the semiconductor film, typically a few percent (in number). Depending on the quantity of germanium ions implanted, the percentage of germanium in the silicon-germanium film can vary for example between 1% and 50%, advantageously between 5% and 45%.

The implantation step performed on the substrate enables germanium atoms to be introduced into one or several layers of the substrate. Implantation of the germanium atoms in semiconductor material film 3, through protection film 4, modifies the concentration profile in the substrate and more particularly in semiconductor material film 3 in comparison with implantation without protection film 4.

In conventional manner, the implantation conditions are imposed on the one hand by the technical performances of the implantation equipment and on the other hand by the quantity of germanium and by the germanium profile required in semiconductor material film 3. The implantation energy defines the depth and profile of the dopants. The implantation conditions are chosen to place a required concentration of germanium atoms at a precise thickness of the substrate.

In conventional manner, semiconductor material film 3 implanted with germanium is transformed into an amorphous film. When the substrate is a bulk substrate, there is always a deep part of the substrate that is not modified, which allows recrystallization of the semiconductor film from a crystal seed. The same is appreciably the case when implantation is performed in a substrate of partially depleted semiconductor on insulator type for which the thickness of semiconductor material film 3 is large.

In the case of thin films made from semiconductor material, the whole thickness of the film is amorphized and it is no longer possible to recover the crystalline information lost when implantation is performed. In order to prevent the energy ion implantation from sinking into the whole of the thickness of semiconductor material layer 3, implantation is performed through protection layer 4.

Simulations have shown that for films 3 with a thickness comprised between 9 and 16 nm, germanium implantations at 3 keV, 4 keV or 5 keV with implantation doses ranging from $5*10^{15}$ $cm^{-2}$ to $5*10^{16}$ $cm^{-2}$ result in complete amorphization of film 3.

Figure 2:
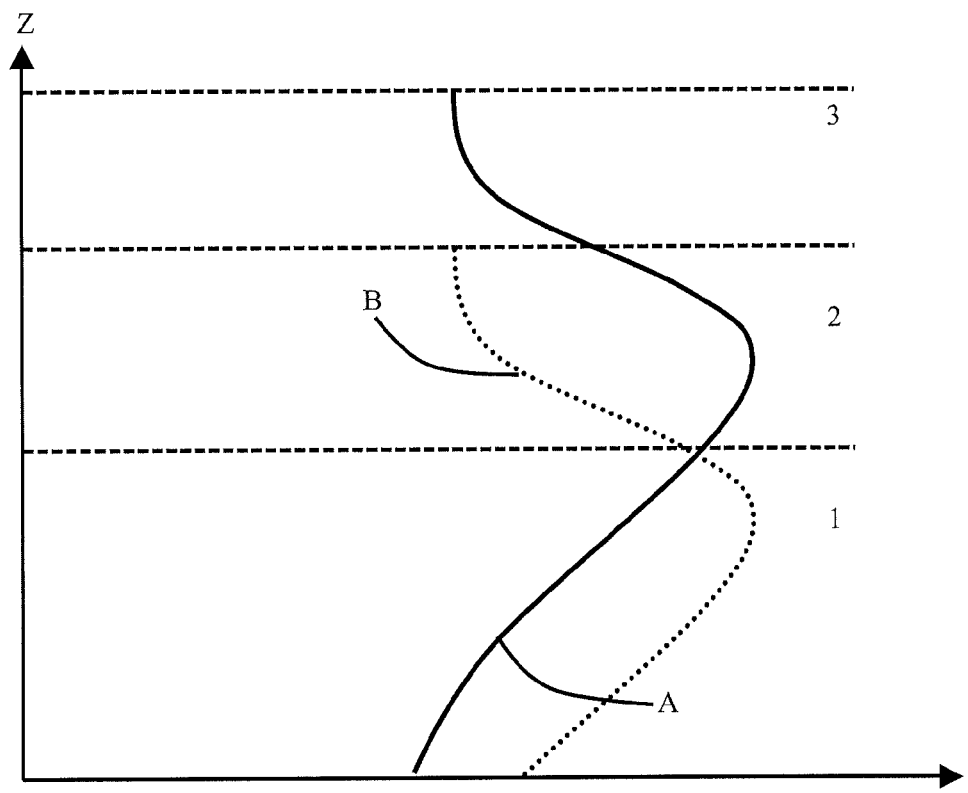
FIG. 2 represents the germanium profile in the substrate with and without a protection layer, in schematic manner.

Protection layer 4 enables semiconductor material layer 3 to be artificially thickened. In this way, the germanium ions have a larger distance to travel which enables the maximum of the germanium concentration to be placed in the top part of semiconductor material layer 3. An example of shifting of the implantation profile is illustrated in FIG. 2 between areas A and B. Area A corresponds to an area of film 3 covered by protection layer 4. Area B corresponds to an uncovered layer.

The germanium ions are implanted in semiconductor material film 3 through protection layer 4 so as to form an amorphized area in contact with protection layer 4 and a crystalline area in contact with the electrically insulating film. After implantation, there is a superposition of an amorphous area and a crystalline area in film 3.

Under the implantation conditions described above, simulations have shown the presence of a crystalline area for films 3 having a thickness of 3 nm, 4 nm, 5 nm, 6 nm and 7 nm by means of a protection layer 4 made from silicon oxide having a thickness comprised between 4 and 6 nm. Conclusive results are observed when the protection layer has a thickness comprised between 4 and 10 nm. This crystalline area enables recrystallization of a possible amorphous area.

As represented in FIG. 2, when implantation is performed, the concentration of germanium atoms (implanted in the form of ions) follows a predefined profile having a maximum concentration of germanium atoms located at depth Rp. This depth is also called mean implantation depth Rp and is defined by the implantation energy and by the stopping power of the materials passed through. The distribution of the atoms implanted along the axis Z can be assimilated to a Gaussian having a maximum concentration located at Rp. Curve plot A illustrates the implantation profile of germanium atoms in the substrate with protection film 4. Curve plot B illustrates the implantation profile without protection film 4, the implantation conditions being identical. Although the same quantity of germanium is sent in the direction of the substrate, a smaller quantity of these atoms is incorporated in semiconductor film 3 in the case of curve B in comparison with what is observed with curve A.

The quantity of ions implanted in the substrate is a function of the implantation time. Implantation can be performed by a conventional implanter or by plasma doping, even if the implantation profile is different.

In general manner, for a silicon film having a thickness of less than 10 nm, the implantation energy is comprised between 1 keV and 10 keV preferably between 2 keV and 6 keV. Under these conditions, the thickness of protection layer 4 is comprised between 2 and 10 nm and preferably between 3 and 6 nm. In this configuration, the maximum concentration of the germanium profile is located in film 3.

The implanted germanium dose is comprised between $1*10^{15}$ $cm^{-2}$ and $5*10^{16}$ $cm^{-2}$ and preferably between $5*10^{15}$ cm$^{-2}$ and 5*10$^{16}$ cm$^{-2}$ and more preferably between 5*10$^{15}$ cm$^{-2}$ and 1*10$^{16}$ cm$^{-2}$ so that the germanium concentration is comprised between 1% and 50% according to the conditions indicated in the foregoing.

For an implantation according to the prior art, the thinner semiconductor material film 3 is, the lower the energy used has to be. However, the technical performances of the equipment do not make it possible to work below a limit energy which imposes a minimum value of depth Rp attainable by an equipment item. In other words, when semiconductor material film 3 is too thin, the implantation step dopes support 1 instead of semiconductor material film 3. It is then no longer possible to have a large doping of the semiconductor film without increasing the implantation time and risking amorphization of the semiconductor material film. If semiconductor film 3 is amorphized, its crystalline information is lost and its electric performances are considerably degraded.

In a first example case, the method enables a thin layer of semiconductor material, for example a layer having a thickness of less than 10 nm and more particularly a layer having a thickness of less than 8 nm, to be efficiently doped without risking complete amorphization of film 3. The germanium ions first pass through protection layer 4, thereby losing a part of their energy. They then sink into layer of semiconductor material 3 and stop in the top part of layer 3, i.e. in the portion of layer 3 in contact with protection layer 4. The bottom part of layer 3 is hardly touched by the germanium ions and with a low energy which limits the risks of amorphization. In a preferred embodiment, the implantation conditions and the thickness of protection layer 4 are chosen so as to prevent amorphization of the bottom third of semiconductor material layer 3. Good results have been obtained for a semiconductor material film having a thickness comprised between 3 and 8 nm.

In a second example case, the technical capabilities of the implantation equipment do not enable a low-energy ion beam to be delivered compatible with introduction of the germanium ions in a part of semiconductor material film 3 only. In this case, the use of protection layer 4 enables the distance covered by the germanium ions before stopping in the semiconductor material film to be increased. This approach for example makes it possible to use high-energy equipment to dope a thin film which requires low-energy equipment. The excess energy is lost in protection layer 4.

In other words, when the technical capacities of the implantation equipment do not enable the maximum germanium concentration to be placed at the required depth, it is advantageous to cover semiconductor material film 3 by protection film 4 in order to displace the position of the maximum germanium concentration into the semiconductor film. The method ensures efficient doping of the semiconductor film arranged at the surface of the substrate, although the minimum mean implantation depth Rp authorized by the equipment is greater than the thickness of semiconductor film 3.

This method presents an interest for silicon films 3 having a thickness of less than 10 nm as these films are thin which means that the implantation equipment has to be made to operate in an operating range where the variabilities of operation are greater.

This method presents an even greater interest for silicon films 3 having a thickness of less than 8 nm and more particularly in the 4-8 nm range as these films are very thin which means that the implantation equipment has to be made to operate in an operating range where the ion beam is not stable. Certain implantation conditions are quite simply not available at the current time with the equipment present on the market.

The use of protection layer 4 means that the implantation equipment can be made to operate under more stable operating conditions which makes the fabrication method more robust. This also enables thin transistors to be produced by implantation whereas suitable equipment is not yet present on the market.

For example purposes, for an implantation at 3 keV, the maximum concentration of the implantation profile is situated at 7 nm from the surface of film 3 in the absence of layer 4. The maximum concentration of the implantation profile is situated less than 0.5 nm from the interface between film 3 and layer 4 when the latter is formed by a layer of silicon oxide having a thickness equal to 6 nm. The choice of the thickness of layer 4 enables the position of the maximum concentration to be placed with respect to the surface of film 3. Identical results have been observed for other implantation energies.

As indicated in the foregoing, it is advantageous to form a protection layer 4 that is homogeneous in thickness and composition so that the stopping power of layer 4 is constant. The implantation profile is therefore identical in all the areas covered only by protection layer 4.

As a variant, the thickness and composition of protection layer 4 enable the energy loss of the germanium ions in protection layer 4 to be defined. This therefore makes it possible to define the energy which the ions will have when they reach the semiconductor material layer.

In order to form silicon-germanium areas with different germanium concentrations, it is advantageous to form a non-homogenous protection layer 4. Protection layer 4 can present different thicknesses and/or different compositions. These non-homogeneities result in a shift of the implantation profile according to the areas. This shift is expressed by differences in the quantity of germanium ions incorporated and therefore by shifts in the final germanium concentration. It therefore becomes easy to form areas with different concentrations with the same implantation step.

The use of a protection layer 4 having a variable stopping power according to the different areas enables the implantation depth in the substrate and therefore the final concentration of the implanted area to be modulated. In this way, areas with different germanium atom concentrations can be formed, for example a first area with a first germanium concentration and a second area with a second germanium concentration. The two areas are laterally offset, i.e. in a direction perpendicular to the axis Z and corresponding to a first area of protection layer 4 with a first composition and/or a first thickness different from the second composition and/or the second thickness of a second area of layer 4.

For example purposes, for a germanium implantation at 4 keV with a dose of 1*10$^{16}$ cm$^{-2}$, the germanium concentration varies between 25% and 30% when the thickness of silicon oxide protection layer 4 varies between 4 and 6 nm. The thickness of film 3 is constant and equal to 5 nm. This behaviour is also present for higher or lower implantation energies and for other implanted doses.

In preferential manner, the substrate is completely covered to prevent the formation of amorphous areas in film 3.

In preferential manner, the mean implantation depth Rp is placed within semiconductor film 3, in even more preferential manner in the middle of semiconductor film 3. In this way, the maximum concentration is located in semiconductor film 3 which makes it possible to reduce the duration of the implantation step for a given quantity of dopants and to reduce the risk of amorphization of semiconductor film 3. The mean implantation depth Rp can be placed in layer 4.

Placing the mean implantation depth Rp in the centre of semiconductor film 3 (along the axis Z) or in immediate proximity to the centre of the semiconductor film enables the doping method to be made more robust. A small variation of the thickness of semiconductor film 3 and/or of protection film 4 does not considerably modify the quantity of germanium atoms incorporated per surface unit. In this manner, a small variation of the thickness of silicon film 3 will not greatly modify the quantity of incorporated germanium atoms.

In other words, in order to facilitate implantation of the germanium atoms in the semiconductor film, the latter is artificially thickened by means of protection film 4. A part of the implanted ions is lost as the ions are located in protection film 4, but the final quantity of germanium atoms incorporated in semiconductor film 3 is greater or appreciably identical in comparison with implantation without protection film 4 and the implantation energy is lower in the semiconductor film which reduces the risks of amorphization.

This approach is all the more advantageous the smaller the thickness of the semiconductor film with respect to the minimum dopant profile (the minimum value of Rp) that the implantation is able to provide. The method enables the implantation step to be made less sensitive to the thickness variations and to amorphization phenomena.

Whereas the first idea is to seek to reduce the implantation energy to introduce the maximum of dopants into the semiconductor film, in the present case a protection film 4 is introduced, at least when the implantation step is performed, to displace the maximum quantity of germanium atoms into the volume of semiconductor film 3. The technical limitations of the implantation equipment are partially compensated by the use of protection film 4 which can be sacrificial.

Once implantation has been performed, annealing is performed in order to repair the implanted area and to place germanium atoms in electrically active positions. Annealing enables a silicon-germanium alloy area with a first germanium concentration or even several areas with different concentrations to be formed.

Recrystallization of film 3 is performed from the bottom part of the film, i.e. the area in contact with electrically insulating film 2. The annealing temperature is lower than for a germanium condensation method which enables a germanium profile close to that defined by the implantation step to be kept. However, it is possible to increase the thermal budget of the annealing in order to increase diffusion of the germanium atoms. For example purposes, annealing at 600° C. for 1 minute enables the amorphous area to be recrystallized. Such a thermal budget for example makes it possible to perform germanium implantation after formation of the insulation trenches or even after definition of the gate electrode, unlike a germanium condensation method which industrially requires annealing temperatures of about 1050° C.

Implantation of the dopants in the substrate to form a ground plane, i.e. a counter-electrode, can be performed before or after recrystallization annealing. The choice of sequencing of these steps can be influenced by the position of the insulation trench fabrication step. The insulation trenches enable the devices to be electrically insulated within the substrate.

Implantation and annealing can be configured such that the bottom part of film 3 is poorer in germanium atoms or even that bottom part of film 3 is devoid of germanium atoms. This method makes it possible to form a germanium concentration gradient, over a small thickness, enabling formation of a bottom area with a low germanium atom content. The minimum germanium concentration is located at the interface between semiconductor material film 3 and electrically insulating film 2.

For example purposes, germanium implantation with an energy of 3 keV and a dose of $5*10^{15}$ cm$^{-2}$ can be performed through a protection layer of 5 nm made from silicon oxide. For a 7 nm silicon film, the maximum germanium concentration is located less than 2 nm from the interface between film 3 and protection layer 4. This configuration enables a maximum germanium concentration to be formed that is close to 20% at the interface with film 4 and less than 1% at the interface with film 2.

In a particular embodiment, implantation of the germanium ions is performed before the substrate is etched to form electric insulation trenches and filling of these trenches by an electrically insulating material 2. The insulation trenches are used to electrically separate the transistors inside film 3.

In this case, protection layer 4 can also be used as etch stop layer in the chemical mechanical polishing step which defines the position of the insulation trenches. It is however advantageous to use a thicker layer deposited on protection layer 4.

Figure 3:
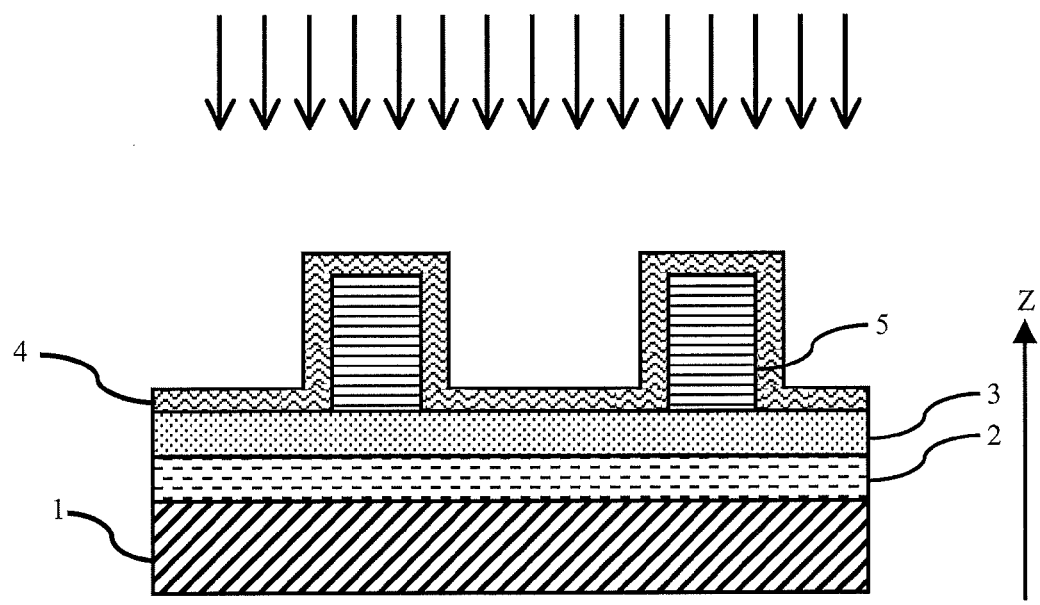
FIGS. 3 and 4 represent a particular embodiment of a field effect device, in schematic manner in cross-section.

In a particular embodiment illustrated in FIG. 3, protection film 4 covers film 3 and a masking pattern 5. It is also possible to provide for masking pattern 5 to cover protection film 4. Masking pattern 5 is configured to prevent introduction of germanium ions into the area covered by masking pattern 5. This masking of the surface of film 3 enables silicon-germanium alloy areas to be formed next to silicon areas. The material forming masking pattern 5 is for example a resin, but other materials can be envisaged such as a dielectric or a polycrystal material. It is also possible to form masking pattern 5 next to protection layer 4. Masking pattern 5 and protection layer 4 can be formed by the same material but they present different thicknesses.

Following implantation, a part of semiconductor film 3 is not amorphized as a part of film 3 has not been reached by the germanium atoms or the quantity of germanium atoms able to reach the interface with the electrically insulating material film is not sufficient to cause amorphization of the whole thickness of film 3.

As the crystalline information of the semiconductor film has been preserved at least on the bottom part of the film, it is possible to perform thermal annealing which will heal the implanted semiconductor film and form a silicon-germanium alloy having electric qualities compatible with formation of a transistor channel.

The crystalline information lost in the amorphized area will be reproduced from the non-amorphized and therefore crystalline area. Depending on the embodiments, protection film 4 can be kept for the thermal annealing step or eliminated before the thermal annealing step.

In a particular embodiment which can be combined with the foregoing embodiments, the thermal annealing can be configured to have a constant germanium concentration over the whole thickness of the semiconductor film. In an alternative embodiment, the thermal annealing is configured such as to have a germanium concentration gradient over the thickness of the semiconductor material film. The area that is most highly doped with germanium is the area in contact with protection film 4 and the germanium concentration decreases progressively as the distance from protection film 4 increases. In a particular embodiment, the interface between the semiconductor film and electrically insulating film 2 is devoid of germanium atoms, i.e. with a germanium atom concentration of less than $10^{20}$ atoms/cm$^3$.

In comparison with an epitaxy step, the germanium concentration is more homogenous as the charge effects are reduced. It is then possible to form SiGe areas and pure silicon areas without any fear of the charge effects of selective epitaxy.

Figure 4:
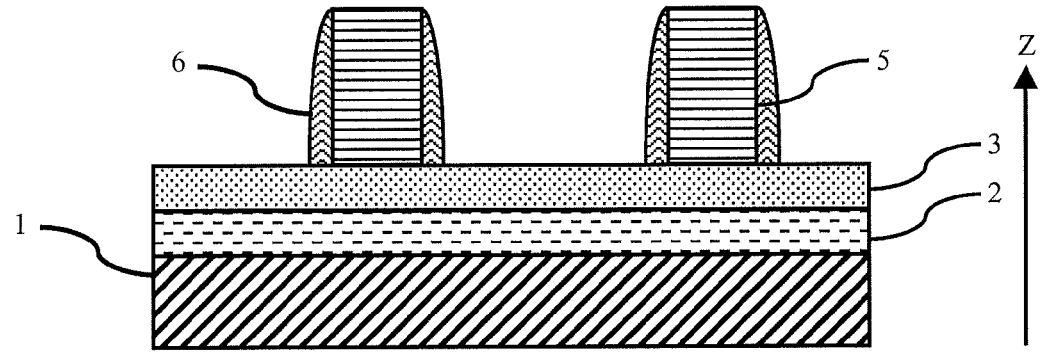

In a particular embodiment illustrated in FIG. 3, masking pattern 5 is formed by a gate electrode. Germanium implantation is performed in the source/drain electrodes in order to modify the material bordering the conduction channel and to introduce strains into the channel. The mesh parameter of silicon-germanium being higher than that of silicon, the channel is compression strained. In advantageous manner illustrated in FIG. 4, protection layer 4 is formed by the material defining lateral spacers 6.

Figure 5:
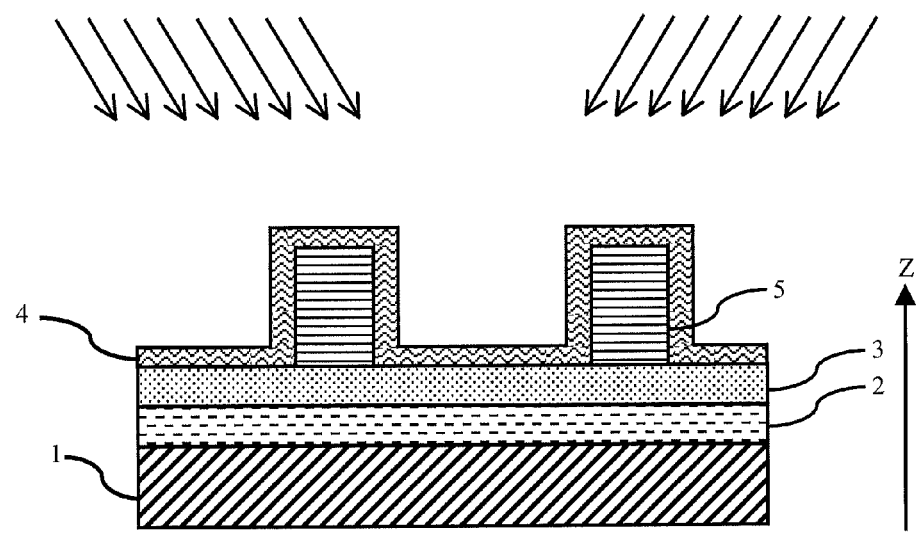
FIG. 5 represents a particular embodiment of a silicon-germanium area, in schematic manner in cross-section.

In a particularly advantageous embodiment illustrated in FIG. 5, the gate electrode is formed on semiconductor material film 3. Protection layer 4 is deposited on film 3 and on gate electrode 5. Implantation of the germanium ions is performed through the protection layer by means of tilted implantation, i.e. by means of implantation having a germanium ion trajectory that is offset by several degrees with respect to the perpendicular to the surface of the substrate.

This tilted implantation is particularly interesting for transistors of small dimensions as the tilt angle is reduced and the germanium ions are able to reach all the regions of the conduction channel without needing to diffuse when activation annealing is performed.

Figure 6:
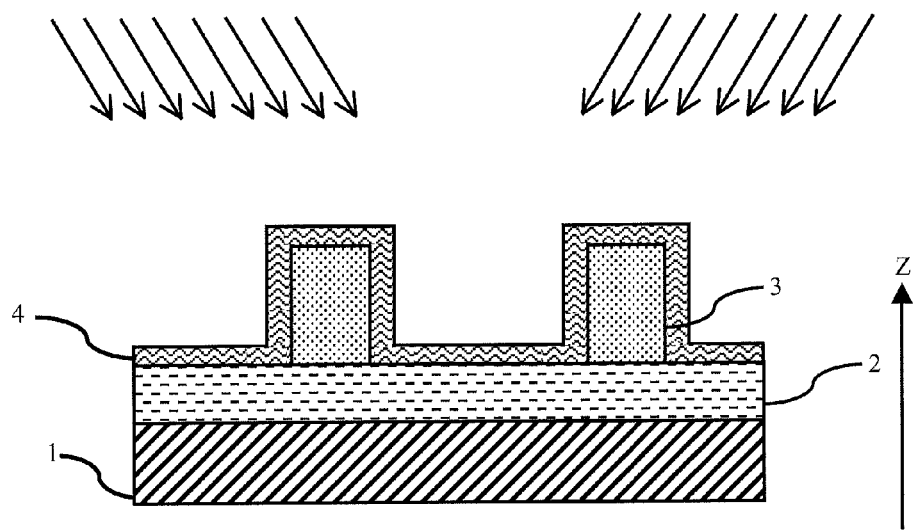
FIG. 6 represents another particular embodiment of a silicon-germanium area, in schematic manner in cross-section.

Although the figures illustrate an implantation with a planar architecture, the method can be used to dope silicon films with three-dimensional architectures. In this configuration illustrated in FIG. 6, the two main surfaces of semiconductor material film 3 are covered by protection layer 4. The thickness of film 3 correspond to the smallest dimension of the pattern or of the layer, here the thickness is measured perpendicularly to the direction Z.

In a particular embodiment that can be combined with the foregoing embodiments, it is advantageous to perform several germanium implantation steps using several implantation energies in order to form a particular germanium profile in film 3. It is also possible to adjust the implantation angles between the different implantations and/or on the protection layer in order to form a particularly advantageous germanium profile.

The implantation method gave very good results under the following conditions. The thickness of the semiconductor material film is comprised between 3 and 8 nm. The thickness of the protection film is comprised between 4 nm and 10 nm in particular if the latter is made from silicon oxide, silicon nitride, hafnium oxide, silicon and hafnium oxide or a stack of the latter. The implantation energy is comprised between 2 keV and 6 keV. The dopant dose is comprised between $5*10^{14}$ and $5*10^{16}$ cm$^{-2}$ for example for conventional dopant impurities, in particular boron, phosphorus and arsenic.

These specific conditions enable a silicon-germanium alloy film to be easily formed by ion implantation even when the initial thickness of the semiconductor material is small, i.e. less than 8 nm.

The method may then not comprise a germanium condensation step, i.e. an oxidation step of the implanted semiconductor film to form a material that is richer in germanium.

The invention claimed is:

1. A method for producing a field effect transistor successively including:
   providing a substrate of semiconductor on insulator type successively comprising: a support, an electrically insulating film, a crystalline silicon film, and a protection layer, wherein the crystalline silicon film has a thickness comprised between 4 and 8 nm
   implanting germanium ions in the crystalline silicon film through the protection layer so as to form an amorphized area in contact with the protection layer superposed on a crystalline layer in contact with the electrically insulating film,
   annealing the silicon film so as to recrystallize the amorphized area from the crystalline area and to form a silicon-germanium alloy area with a first germanium concentration.

2. The method according to claim 1, wherein a quantity of germanium ions implanted in the crystalline silicon film is configured so as to form a silicon-germanium area comprising between 5% and 45% of germanium.

3. The method according to claim 1, further comprising covering the crystalline silicon film by a masking pattern configured to prevent introduction of the germanium ions into an area covered by the masking pattern.

4. The method according to claim 1, wherein the protection layer comprises a first area having a first composition and/or a first thickness and a second area having a second composition and/or a second thickness different from the first composition and/or the first thickness, and wherein the annealing step forms a first silicon-germanium alloy with the first germanium concentration and a second silicon-germanium alloy with a second germanium concentration different from the first concentration, the first silicon-germanium alloy being covered by the first area of the protection layer and the second silicon-germanium alloy being covered by the second area of the protection layer.

5. The method according to claim 1, wherein the substrate comprises a gate electrode formed above the crystalline silicon film and implantation of germanium ions is performed with a tilt angle configured to form a silicon-germanium conduction channel.

6. The method according to claim 1, wherein the substrate comprises a gate electrode formed above the crystalline silicon film and implantation of germanium ions is performed so as to form silicon-germanium source and drain electrodes and a silicon conduction channel.

7. The method according to claim 1, wherein a thickness of the crystalline silicon film is comprised between 3 and 8 nm, a thickness of the protection layer is comprised between 4 and 10 nm, an implantation energy is comprised between 2 kevV and 6 keV and an implanted dose is comprised between $5*10^{14}$ and $5*10^{16}$ cm$^{-2}$.

* * * * *